US005896268A

United States Patent [19]

Beavers

[11] Patent Number: 5,896,268
[45] Date of Patent: Apr. 20, 1999

[54] ENCLOSURE FOR HIGH-DENSITY SUBSCRIBER LINE MODULES

[75] Inventor: Roger L. Beavers, Brown Summit, N.C.

[73] Assignee: Abacon Telecommunications Corporation, Greensboro, N.C.

[21] Appl. No.: 08/909,242

[22] Filed: Aug. 11, 1997

[51] Int. Cl.$^6$ ........................................ H05K 7/20
[52] U.S. Cl. .................... 361/690; 361/691; 361/694; 361/704; 361/716; 361/785; 361/730; 174/52.3; 174/17.05
[58] Field of Search ...................... 361/690, 691, 361/694, 695, 704, 736, 785, 796, 800, 724, 728, 730; 174/17 R, 17.05, 17.08, 52.3; 312/223.1, 223.2; 165/80.3, 185

[56] References Cited

U.S. PATENT DOCUMENTS

| | | | |
|---|---|---|---|
| 4,315,300 | 2/1982 | Parmerlee et al. | 361/382 |
| 4,447,856 | 5/1984 | Takahashi et al. | 361/383 |
| 4,514,746 | 4/1985 | Lundqvist | 361/385 |
| 4,549,602 | 10/1985 | Espinoza | 165/80.2 |
| 4,935,845 | 6/1990 | Schwehr et al. | 361/384 |
| 5,121,290 | 6/1992 | Azar | 361/384 |
| 5,398,161 | 3/1995 | Roy | 361/727 |
| 5,450,272 | 9/1995 | Van Gaal et al. | 361/690 |

OTHER PUBLICATIONS

818-/819-Type Repeater Cases; Description, Installation, Splicing, and Maintenance Manual; AT&T, Undated, admitted prior art.

*Primary Examiner*—Leo P. Picard
*Assistant Examiner*—Boris L. Chervinsky
*Attorney, Agent, or Firm*—Rhodes Coats & Bennett, L.L.P.

[57] ABSTRACT

A repeater case for high-density subscriber lines includes a repeater base and repeater case housing formed of a fiberglass composite and together forming a sealed enclosure for a pressurized atmosphere. The repeater case housing has a removable cover secured in position by torque bolts, a sealing gasket to sealingly receive the cover, a plurality of high-density subscriber line module slots and a plurality of printed circuit boards mounted to certain of the slots with gaps between adjacent printed circuit boards, the printed circuit boards being adapted to receive respective high-density subscriber line modules. The repeater base has a cable inlet, and each of the plurality of printed circuit boards is provided with a connection to the cable inlet and a connector to electrically receive one of the high-density subscriber line modules. The repeater base also includes an electrically insulating barrier between the cable inlet and the printed circuit boards. A plurality of openings in the barrier permit cooling atmosphere to pass from the repeater base toward the modules so that cooling atmosphere may pass over the high-density subscriber line modules through the barrier and the gaps between the printed circuit boards.

23 Claims, 3 Drawing Sheets

ENCLOSURE FOR HIGH-DENSITY SUBSCRIBER LINE MODULES

BACKGROUND OF THE INVENTION

The present invention relates to improvements in repeater cases and designs therefore for high-density subscriber lines. Repeater cases have been known for years, and the technology was well developed for T1 telecommunication lines. Extensive specifications for 818–/819-type repeater cases have been promulgated by AT&T describing the type of cases involved. These cases are designed to hold sensitive telecommunications equipment in relatively unfavorable environments. In particular, they are designed for installation in manholes or on telephone poles exposed to the weather. Accordingly, in order to protect the contents, the housings of the cases provide environmental protection and seal the contents from attack by environmental elements such as water and the like.

Recently, the repeater cases which were originally designed to hold T1 line cards have been used to hold high-density subscriber line modules. The high-density subscriber line modules are somewhat larger than T1 modules, resulting in only every other one of the slots provided in the T1 case being used for the high-density subscriber line modules (hereinafter referred to as "HDSL modules").

The HDSL modules work well in the T1 repeater cases, except that it has been found that the modules prematurely fail due to excessive heat buildup. Premature failure adds considerably to the cost in having to replace the modules, with costs coming from the modules themselves, as well as the labor to get into the casing to replace the modules. There is also the problem of loss of reliability arising from the premature failures. Accordingly, there is a need in the art for a solution to the heat buildup problem in high-density subscriber line cases.

SUMMARY OF THE INVENTION

The present invention fulfills this need in the art by providing a repeater case for high-density subscriber lines including a repeater base, and a repeater case housing having a plurality of high-density subscriber line module slots and a plurality of connectors mounted to certain of the slots with gaps between adjacent connectors, the connectors being adapted to receive respective high-density subscriber line modules, so that cooling atmosphere may pass over the high-density subscriber line modules through the gaps.

In a preferred embodiment, the connectors are each mounted to an individual printed circuit board. Alternatively, a printed circuit board may be mounted in the case having portions aligned to certain of the slots with gaps in the circuit board between adjacent portions and wherein the connectors are each mounted to an individual printed circuit board portion.

Typically, the repeater base and repeater case form a sealed enclosure. Usually, the repeater base includes an inlet valve to allow pressurization of the atmosphere within the repeater case.

The repeater base typically includes a cable inlet and an electrically insulating barrier between the cable inlet and the connectors. The barrier is provided with a plurality of openings to permit cooling atmosphere to pass from the repeater base toward the modules. Preferably, the barrier is Plexiglas acrylic plastic.

The repeater base cable inlet typically connects to each of the plurality of connectors with a connection and each of the plurality of connectors is adapted to electrically receive one of the high-density subscriber line modules.

The repeater case may include a removable cover secured in position by torque bolts. Typically, a sealing gasket sealingly receives the cover.

The case is usually formed of a fiberglass composite.

The invention also provides a method of cooling high-density subscriber line modules in a repeater case including locating a plurality of high-density subscriber line modules and connectors mounted to slots in a repeater case, leaving gaps between the modules and in the module support structure in the case, and permitting cooling atmosphere to pass over the high-density subscriber line modules through the gaps.

Preferably, the locating step takes place as mounting each of the modules to an individual printed circuit board.

Alternatively, the locating step may include mounting each of the modules to portions of a printed circuit board mounted in the case in which the portions are aligned to certain of the slots with gaps in the circuit board between adjacent portions.

The method may include pressurizing the atmosphere within the repeater case.

BRIEF DESCRIPTION OF THE DRAWINGS

The invention will be better understood after a reading of the Detailed Description of the Preferred Embodiment and a review of the drawings in which.

DETAILED DESCRIPTION OF THE PREFERRED EMBODIMENT

Figure 1:
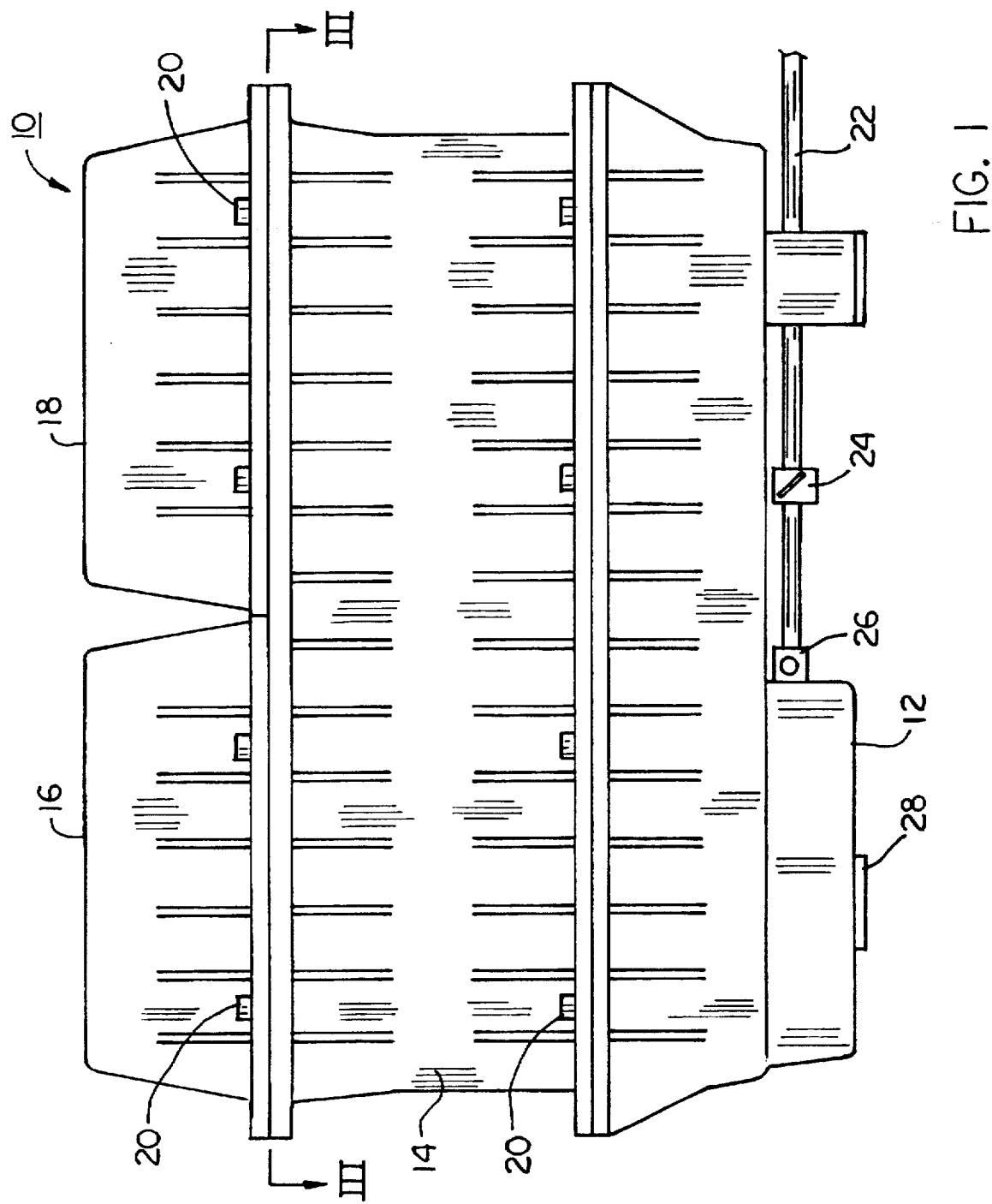
FIG. 1 is a side perspective view of a high-density subscriber lines repeater case according to a preferred embodiment of the invention.

As seen in FIG. 1, a repeater case 10 adapted from the T1 repeater case of AT&T styles 818–819 is shown. Details of those cases are known to those of ordinary skill in the art and will not be elaborated on here, for brevity. The repeater housing 10 includes a molded repeater base 12 and a repeater case housing 14 having cover portions 16 and 18. The base 12 and housing 14 are made of a fiberglass composite which is generally not regarded as an effective heat conductor. The cover portions 16 and 18 are held to the housing 14 with torque bolts 20. The volume inside the cover portions 16 and 18 is generally empty to serve as a heat dissipating plenum. Between the base 12 and housing 14, and housing 14 and covers 16 and 18 are gaskets 30 and 32, not visible in FIG. 1, but seen in FIG. 2. The base 12, repeater case housing 14 and its covers 16 and 18 together form a sealed enclosure which can contain a pressurized atmosphere. The pressurized atmosphere can be admitted through conventional valve arrangements in the base 12, such as pressure relief valve 26 and air bypass valve 24. The base 12 is provided with mounting brackets 28 to permit mounting of the casing 10 in a desired location, typically in a manhole or on a pole, but any suitable mounting may suffice. A stub cable 22 provides a cable inlet 27 into the base 12 for telecommunication lines.

Figure 2:
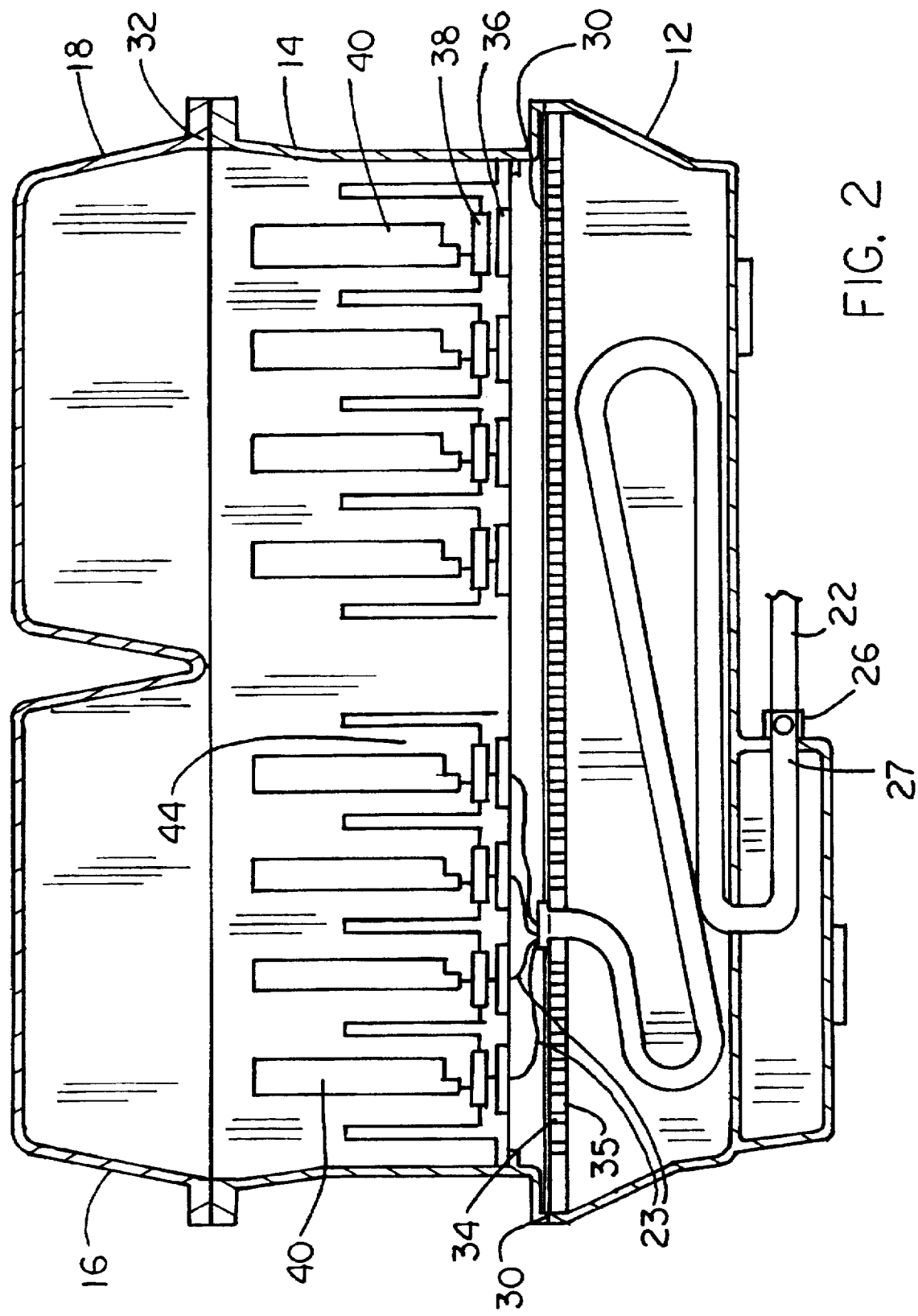
FIG. 2 is a sectional view of the case of FIG. 1 taken along lines II—II, looking in the direction of the arrows.

Referring now to FIG. 2, the stub cable 22 can be seen as dividing into a plurality of individual conductors 23. The conductors 23 pass through an opening in a Plexiglas acrylic plastic barrier 34 and are hard wired to the bottoms of PC boards 36. At the top of the PC boards 36 are mounted electrical connectors 38 suitable for receiving HDSL modules 40. The PC boards 36 are mounted to the inside of housing 14 and thus support the connectors 38 and modules 40.

In conventional T1 casings, the Plexiglas acrylic plastic barrier 34 is provided with a minimal opening for the conductors 23 to pass. The barrier is provided to prevent accidental short circuits between portions of cable 22 and the PC board. The invention includes providing a plurality of additional openings in the Plexiglas acrylic plastic 34 in order to provide an air communication pathway from the interior of the base 12 into the housing 14.

In addition, it is conventional in T1 casings to provide a single PC board extending the full width of the housing 14 on which the T1 or HDSL modules are mounted. This full-length, continuous PC board has been provided with a plurality of connectors, such as connectors 38, mounted to it. However, the conventional, full-length extending PC board blocks any airflow vertically up adjacent to the HDSL modules 40. Thus, the cooling air or other atmospheric component has not been permitted to provide convective cooling of the modules 40. This leads to the modules overheating in stagnant air pools and their premature failure.

The inventor has found that effective cooling to substantially decrease the temperatures achieved within the housing can be obtained by replacing the single, full-length extending PC board with a plurality of small PC board segments 36 with gaps between them to permit cooling atmospheric components to pass over the modules 40. This, coupled with the additional openings 35 in the Plexiglas acrylic plastic barrier 34, provide for the possibility of the atmospheric components to move upwardly over the modules 40 and keep them cool. The atmospheric flow over the modules 40 is more effective to take the heat to the covers 16, 18 of the housing for dissipation by conduction, even though the housing is sealed, thereby preventing venting.

A similar effect can be obtained by using a large PC board with voids or gaps between the connectors 38 to permit the air to flow over modules 40. This construction is within the scope of the invention, although not preferred.

Figure 3:
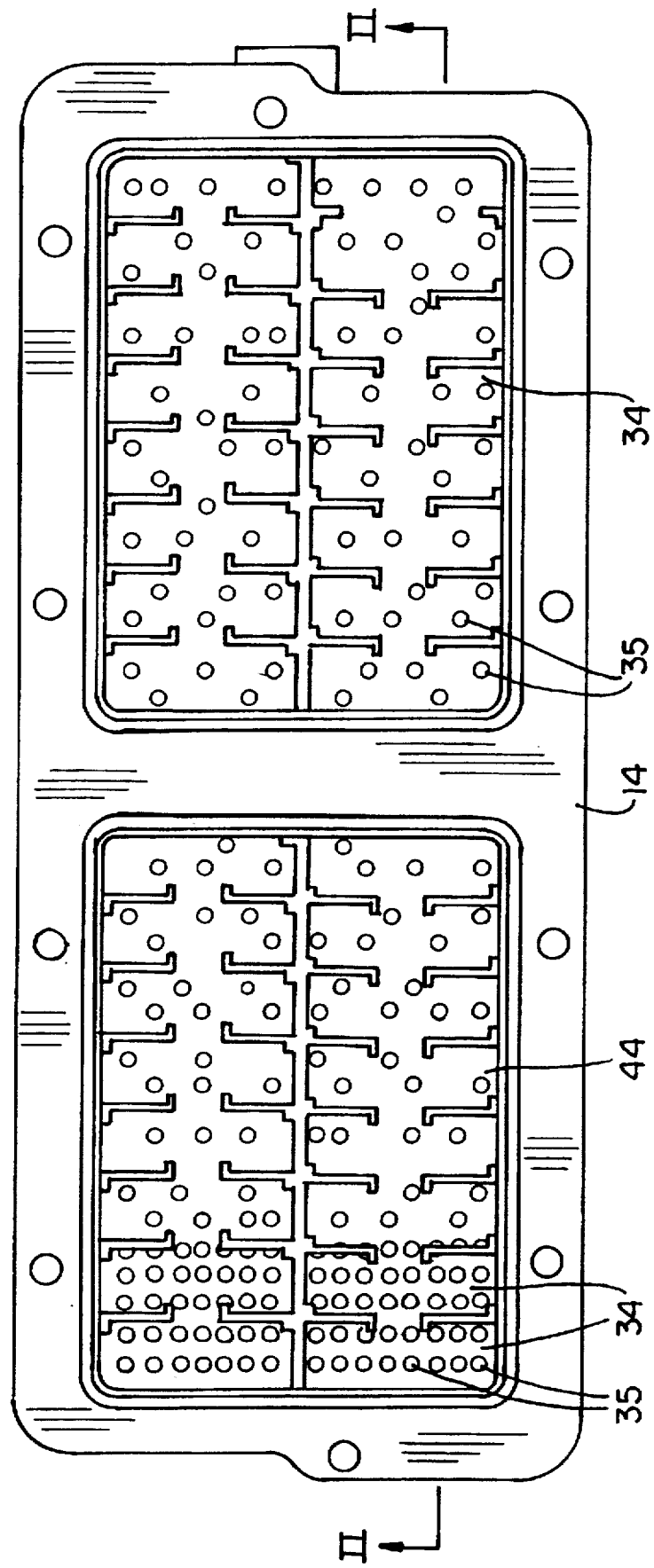
FIG. 3 is a sectional view of the case of FIG. 1 taken along lines III—III, looking in the direction of the arrows.

Referring now to FIG. 3, the locations of the modules 40 in slots 44 within the housing 14 can be seen. The HDSL modules 40 have a considerably greater height in the left to right direction of FIG. 3, taking up almost two slots each. Thus, it is preferred to locate the PC boards 36 and associated connectors 38 and modules 40 in every other one of the slots 44, leaving gaps there between to permit the air or other internal atmosphere to move over the HDSL modules 40.

In addition, the HDSL modules are encased in metallic boxes which provide EMI shielding. The metal also serves as a good heat sink and conductor to pass heat to the air flowing in the gaps between the modules 40. The EMI protection can also be provided with a suitable coating to like end.

In addition to savings from avoiding premature failures of the HDSL modules, the invention provides additional savings in the initial fabrication of the housing. Conventionally, the full-width PC board was provided with a connector 38 for every slot position 44. Thus, every other connector was provided but not used, a waste of the materials and labor involved in providing that connector. By the use of the invention providing a PC board 36 and connector 38 only in every other slot 44, this cost, too, is saved.

"Cooling air or atmosphere" may be any suitable vapor in the repeater case to provide an atmosphere for the contents and may be, but should not be construed to be limited to, conventional air. In particular, relatively pure nitrogen is often used for such purposes and should be deemed to be encompassed.

Those of ordinary skill in the art will appreciate that the invention can be carried out in other forms differing from as specifically outlined herein yet still fall within the scope of the invention, and the claims are to be read as covering such embodiments.

What is claimed is:

1. A repeater case for high-density subscriber lines comprising:
   a. a repeater base, and
   b. a repeater case housing containing,
      i) sidewalls and dividers defining a plurality of high-density subscriber line module slots, and
      ii) a plurality of connectors,
         (a) supported in said housing in an array with a space in the housing on one side of the connectors,
         (b) adapted to receive high-density subscriber line modules, and
         (c) mounted in selected ones of said slots defined by said dividers with atmosphere flow gaps between adjacent connectors, and
         (d) being sufficiently spaced from one another so that when modules are installed in the connectors, a region in the housing between installed modules on the other side of the connectors from the space is in communication with the space in the housing, so that cooling atmosphere may pass over the high-density subscriber line modules through the gaps between the region and the space.

2. A repeater case as claimed in claim 1 wherein said connectors are each mounted to an individual printed circuit board.

3. A repeater case as claimed in claim 1 further comprising a printed circuit board mounted in said case having portions aligned to selected ones of said slots with gaps in the circuit board between adjacent portions and wherein said connectors are each mounted to an individual printed circuit board portion.

4. A repeater case as claimed in claim 1 wherein said repeater base and repeater case form a sealed enclosure.

5. A repeater case as claimed in claim 4 wherein said repeater base includes a valve to allow pressurization of the atmosphere within the repeater case.

6. A repeater case as claimed in claim 1 wherein said repeater base includes a cable inlet and further comprising an electrically insulating barrier between said cable inlet and said connectors, said barrier having a plurality of openings to permit cooling atmosphere to pass from said repeater base toward said modules.

7. A repeater case as claimed in claim 6 wherein said barrier is acrylic plastic.

8. A repeater case as claimed in claim 1 wherein said repeater case includes a removable cover.

9. A repeater case as claimed in claim 8 wherein said repeater case cover is secured in position by torque bolts.

10. A repeater case as claimed in claim 8 further comprising a sealing gasket to sealingly receive said cover.

11. A repeater case as claimed in claim 1 wherein said repeater base includes a cable inlet and each of said plurality of connectors is provided with a connection to said cable inlet and is adapted to electrically receive one of said high-density subscriber line modules.

12. A repeater case as claimed in claim 1 wherein said case is formed of a fiberglass composite.

13. A repeater case as claimed in claim 1 further comprising a plurality of high-density subscriber line modules mounted to said connectors, said modules having a heat conductive EMI shielding.

14. A repeater case for high-density subscriber lines comprising:

a repeater base and repeater case housing formed of a fiberglass composite and together forming a sealed enclosure for an atmosphere, said repeater base including a valve to allow pressurization of the atmosphere within the repeater case, said repeater case housing having a removable cover, a sealing gasket to sealingly receive said cover, a plurality of high-density subscriber line module slots and a plurality of printed circuit boards mounted to selected ones of said slots with gaps between adjacent printed circuit boards, said printed circuit boards being adapted to receive respective high-density subscriber line modules, said repeater base having a cable inlet, wherein each of said plurality of printed circuit boards is provided with a connection to said cable inlet and a connector to electrically receive a high-density subscriber line module, said repeater base further comprising an electrically insulating barrier between said cable inlet and said printed circuit boards, said barrier having a plurality of openings to permit cooling atmosphere to pass from said repeater base toward said modules so that cooling atmosphere may pass over the high-density subscriber line modules through said barrier and said gaps between said printed circuit boards.

15. A method of cooling high-density subscriber line modules in a repeater case comprising:

locating a plurality of high-density subscriber line modules in connectors mounted to slots in a repeater case, leaving atmosphere flow gaps between the modules and support structure in the case, and permitting cooling atmosphere to pass over the high-density subscriber line modules through the atmosphere flow gaps.

16. A method as claimed in claim 15 wherein said locating step comprises mounting each of the modules to an individual printed circuit board.

17. A method as claimed in claim 15 wherein said locating step comprises mounting each of the modules to portions of a printed circuit board mounted in the case in which the portions are aligned to selected ones of the slots, with atmosphere flow gaps in the circuit board between adjacent portions.

18. A method as claimed in claim 15 further comprising sealing the repeater case to form a sealed enclosure and pressurizing the atmosphere within the repeater case.

19. A method as claimed in claim 15 wherein the repeater case has a base with a cable inlet and an electrically insulating barrier between the cable inlet and the modules, and permitting cooling atmosphere to pass through a plurality of openings from the repeater base toward the modules.

20. A method of cooling high-density subscriber line modules in a repeater case with a cable inlet and an electrically insulating barrier between the cable inlet and the modules comprising:

locating a plurality of high-density subscriber line modules in connectors mounted to slots in the repeater case by mounting each of the modules to an individual printed circuit board, leaving atmosphere flow gaps between the modules and module support structure in the repeater case, sealing the repeater case to form a sealed enclosure, pressurizing the atmosphere within the repeater case, and permitting cooling atmosphere to pass through a plurality of openings in the barrier from the repeater base toward and over the high-density subscriber line modules through the atmosphere flow gaps between the support structure and the modules.

21. A repeater case for high-density subscriber lines comprising:

a repeater case housing defining an enclosure containing
   i) sidewalls and dividers defining a plurality of high-density subscriber line module slots, and
   ii) a plurality of connectors,
      (a) supported in said housing in an array with a space in the housing on one side of the connectors,
      (b) adapted to receive high-density subscriber line modules, and
      (c) mounted in selected ones of said slots defined by said dividers with atmosphere flow gaps between adjacent connectors, and
      (d) being sufficiently spaced from one another so that when modules are installed in the connectors, a region in the housing between installed modules on the other side of the connectors from the space is in communication with the space in the housing, so that cooling atmosphere may pass over the high-density subscriber line modules through the gaps between the region and the space.

22. A repeater case for high-density subscriber lines comprising:

a. a repeater base, and
b. a repeater case housing containing,
   i) sidewalls and dividers defining a plurality of high-density subscriber line module slots,
   ii) a printed circuit board mounted in said case with a space in the housing on one side of the printed circuit board, said printed circuit board having portions aligned to selected ones of said slots and gaps in the circuit board between adjacent portions,
   iii) a plurality of connectors,
      (a) supported on said portions of said printed circuit board,
      (b) adapted to receive high-density subscriber line modules, and
      (c) being sufficiently spaced from one another so that when modules are installed in the connectors, a region in the housing between installed modules on the other side of the connectors from the space is in communication with the space in the housing, so that cooling atmosphere may pass over the high-density subscriber line modules through the gaps between the region and the space.

23. A repeater case for high-density subscriber lines comprising:

a. a repeater base having a cable inlet,
b. a repeater case housing containing,
   i) sidewalls and dividers defining a plurality of high-density subscriber line module slots, and
   ii) a plurality of connectors,
      (a) supported in said housing in an array with a space in the housing on one side of the connectors,
      (b) adapted to receive high-density subscriber line modules, (c) mounted in selected ones of said slots defined by said dividers with atmosphere flow gaps between adjacent connectors, and (d) being sufficiently spaced from one another so that when modules are installed in the connectors, a region in the housing between installed modules on the other side of the connectors from the space is in communication with the space in the housing, and iii) an electrically insulating barrier between said cable inlet and said connectors, said barrier having a plurality of openings to permit cooling atmosphere to pass from said repeater base toward said modules, so that cooling atmosphere may pass over the high-density subscriber line modules through the gaps between the region and the space.

* * * * *